(12) United States Patent
Bedgedjian

(10) Patent No.: US 6,775,528 B1
(45) Date of Patent: Aug. 10, 2004

(54) CONTROL METHOD FOR A PHASE-LOCKED LOOP

(75) Inventor: Jean-Christophe Bedgedjian, Champs S/Marne (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 437 days.

(21) Appl. No.: 09/717,968

(22) Filed: Nov. 21, 2000

(30) Foreign Application Priority Data

Nov. 23, 1999 (FR) .......................................... 99 14744

(51) Int. Cl.[7] ................................................ H04B 1/06
(52) U.S. Cl. ................ 455/260; 455/161.2; 455/183.1; 455/180.1
(58) Field of Search ............................ 455/260, 161.2, 455/183.1, 182.2, 180.3, 180.1, 168.1; 331/1 A, 10; 704/205, 226

(56) References Cited

U.S. PATENT DOCUMENTS

| | | | | |
|---|---|---|---|---|
| 4,709,406 A | * | 11/1987 | Omoto | .................... 455/183.1 |
| 5,581,651 A | * | 12/1996 | Ishino et al. | ................. 704/226 |
| 5,686,864 A | * | 11/1997 | Martin et al. | ................ 331/1 A |
| 5,940,747 A | | 8/1999 | Grohgans et al. | ......... 455/168.1 |
| 5,949,281 A | * | 9/1999 | Sharpe | ........................ 455/260 |
| 6,091,304 A | * | 7/2000 | Harrer | .......................... 331/10 |
| 6,512,801 B1 | * | 1/2003 | Ninomiya | .................... 455/260 |

* cited by examiner

Primary Examiner—Edward F. Urban
Assistant Examiner—Lana Le
(74) Attorney, Agent, or Firm—Peter Zawilski

(57) ABSTRACT

The information delivered on the output of a detector linearly varies with the detection error only if this error lies in a certain range. To recover larger errors, oscillators are used which cover a wide frequency band part by part until they find the part of the band on which the detector works linearly and thus which the loop can lock on to. A rapid method of covering the frequency band is disclosed. The method includes selecting an initial part of the band to be covered which is close to the center of the frequency band and selecting a next part of the band to be covered which is formed by the band part that has not yet been covered and is closest to the initial part in the direction of the rising or falling frequencies, as a function of a predefined criterion.

5 Claims, 4 Drawing Sheets

CONTROL METHOD FOR A PHASE-LOCKED LOOP

FIELD OF THE INVENTION

The invention relates to a communication system comprising at least a signal transmitter and a signal receiver, said signal receiver including at least a phase-locked loop which comprises an error detector and control means for controlling a local oscillator which may cover a certain frequency band part by part to minimize an error determined by said error detector.

The invention also relates to:
- a signal receiver intended to be used in such a communication system,
- an integrated circuit which comprises at least such a phase-locked loop,
- a control method of controlling a local oscillator used in such a phase-locked loop, and
- a computer program comprising means for implementing such a control method.

The invention has highly interesting applications in the field of telecommunications, for example, for receiving digital signals broadcast by satellite or by cable.

BACKGROUND OF THE INVENTION

Such a phase-locked loop is notably described in paragraphs 1—1 and 4—4 of the book "Phaselock Techniques" by Floyd M. Gardner published in the USA by John Wiley & Sons, Inc. in April 1967. In this book the scanning of the frequency band which the oscillator covers is obtained by applying to the input of the local oscillator a voltage that rises linearly. This voltage is delivered, for example, by an independent voltage generator.

SUMMARY OF THE INVENTION

It is an object of the invention to improve this scanning method for accelerating the locking of the loop.

Therefore, a system according to the invention and as described in the opening paragraph is characterized in that said control means comprise:
- means for choosing an initial part of the band to be covered, which is close to the center of said frequency band,
- means for choosing as the next part of the band to be covered the part that has not yet been covered and is closest to the initial part in the direction of the rising or falling frequencies, as a function of a predefined criterion.

In lieu of linearly covering the frequency band in one direction or the other, as this is the case in cited prior art, the invention permits to determine an order in which the frequency band is covered part by part as a function of a predefined criterion, starting from a substantially central position relative to the frequency band to be covered. The invention also permits on average to limit the number of parts of the band to be covered to obtain the locking of the loop.

Various criteria may be used. In a first embodiment the next part to be covered is chosen alternatively in one direction and then in the other. In a second embodiment the part is chosen in a totally random fashion. And in a third particularly advantageous embodiment the part is chosen as a function of the sign of the error obtained for the previous part of the band.

BRIEF DESCRIPTION OF THE DRAWINGS

These and other aspects of the invention are apparent from and will be elucidated, by way of non-limitative example, with reference to the embodiment(s) described hereinafter.

In the drawings.

DESCRIPTION OF AN EMBODIMENT OF THE INVENTION

Figure 1:
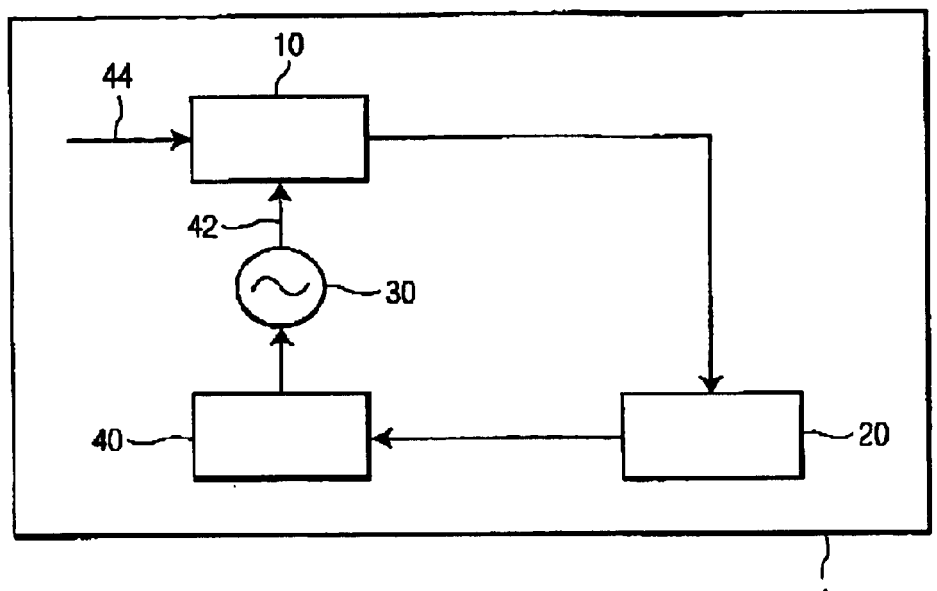
FIGS. 1 and 2 represent each a diagram of an example of a phase-locked loop according to the invention.

In FIG. 1 is represented a first example of a phase-locked loop according to the invention. This loop 1 comprises an error detector 10, a loop filter 20, an oscillator 30 digitally controlled by a controller 40 for providing an oscillation 42. The detector 10 receives, on the one hand, the oscillation 42 produced by the oscillator 30 and, on the other hand an input signal 42. The controller 40 commands the oscillator 30 to slave the oscillation 42 to the input signal 44.

Figure 2:
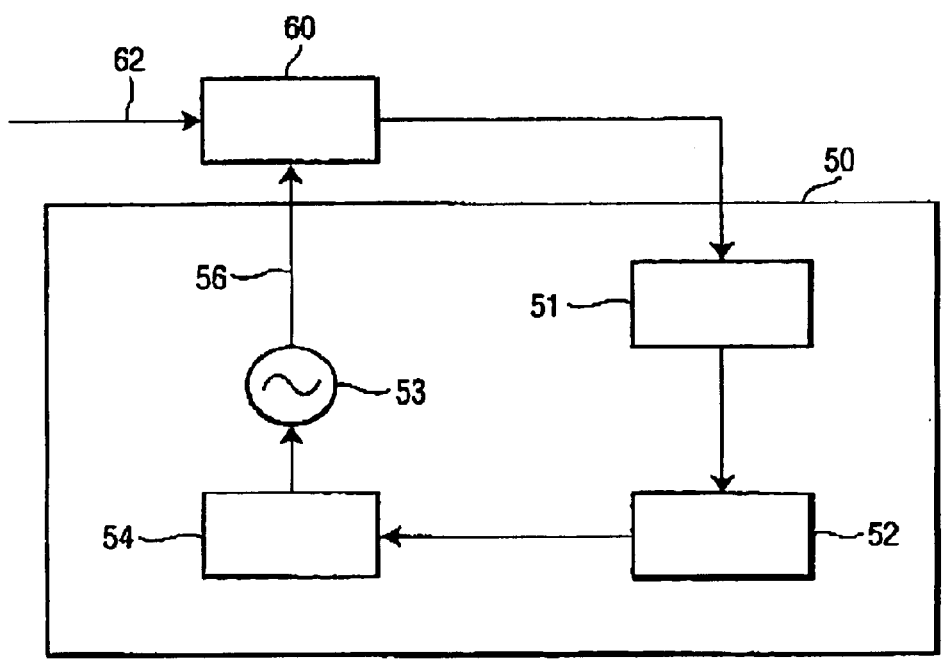

In FIG. 2 is represented a second example of a phase-locked loop according to the invention. This loop 50 comprises an error detector 51, a loop filter 52, an oscillator 53 digitally controlled by a controller 54 for supplying an oscillation 56 to correction means 60. The correction means 60 receive, on the one hand, the oscillation 56 produced by the oscillator 53 (or information derived from this oscillation) and, on the other hand, an input signal 62 to be corrected. The corrected signal is applied to the error detector 51. The controller 54 commands the oscillator 53 to minimize the error detected by the error detector 51.

The error detectors used in this type of phase-locked loop have a limited acquisition range: the information delivered on the output of the detector linearly varies with the error to be detected only if this error lies in a certain range. If one wishes to recover larger errors, oscillators are used which may cover a wide frequency band part by part until the part of the frequency band is used on which the detector operates correctly and thus which the loop may lock on to. In the following of the description the central frequency of the frequency range that may be covered by the oscillators 30 and 53 is denoted $F_c$. The size of the parts of the frequency band is denoted S.

Figure 3:
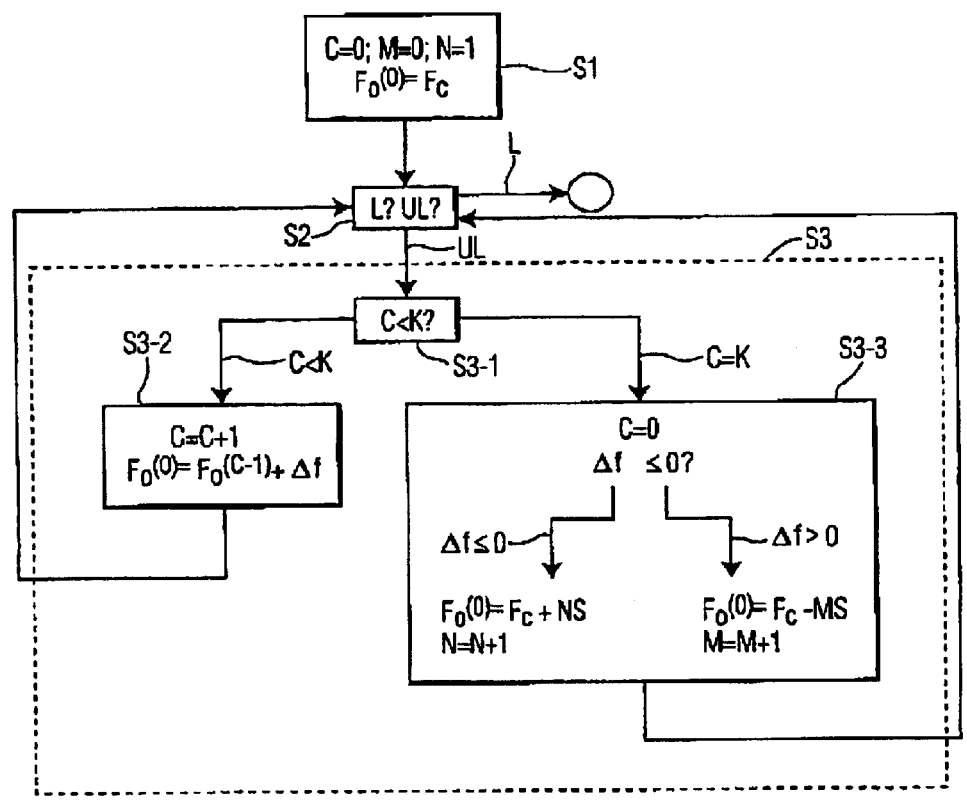
FIG. 3 represents an example of a control method of an oscillator of a phase-locked loop according to the invention.

In FIG. 3 is represented an example of a control method utilized by the controllers 40 and 54. This method comprises various steps Step S1 permits to initialize three variables C, M and N (C=0; M=0 and N=1). C is a counter indicating the maximum number of locking attempts to be made to a part of the band before a next part of the band is passed on to. M is an index indicating the first part of the band that has not yet been covered for the frequencies below central frequency $F_c$. N is an index indicating the first part of the band not yet covered for the higher frequencies than the central frequency $F_c$. The step S1 also has for its object to fix the initial frequency of the oscillator $F_0^{(0)} = F_c$.

Step S2 is a detection step of detecting the locked state (L) or unlocked state (UL) of the loop. The control method is continued by executing step S3 if the loop has not locked on. The control method is terminated when the loop has locked on. The detection of the locked/unlocked state of the loop is made, for example, by monitoring the output of the loop filter. When the value delivered on the output of the filter is lower than a predetermined threshold for a predetermined number of cycles, the loop is considered to be locked on.

Step S3 permits to determine the frequency that is to be produced by the oscillator. The step is divided into several sub-steps.

Step S3-1 tests the value of the counter C. If the value is lower than a predefined threshold K (C<K), the method is continued with the execution of the step S3-2. If not, the method is continued by the execution of step S3-3.

Step S3-2 consists of incrementing the counter C by unity (C=C+1), and of determining the new frequency $F_0^{(C)}$ of the oscillation which is to be produced by the oscillator: in this case $F_0^{(C)}=F_0^{(C-1)}+\Delta f$ (where $\Delta f$ is the correction made by the loop filter). Then the method is resumed at step S2.

Step S3-3 has for its aim to determine the next part of the band to be covered. For this purpose it consists of resetting the counter C to zero (C=0), then testing the signal of the correction $\Delta f$ delivered by the loop filter. If $\Delta f$ is positive or zero, the next part of the band to be covered is the first part of the band that has not yet been covered on the side of the high frequencies ($F_0^{(0)}=F_C+N.S$), and the index N is incremented by unity (N=N+1). If $\Delta f$ is negative, the next part of the band to be covered is the first part of the band that has not yet been covered on the side of the lower frequencies ($F_0^{(0)}=F_C-M.S$), and the index M is incremented by unity (M=M+1). The method is resumed with step S2.

Figure 4:
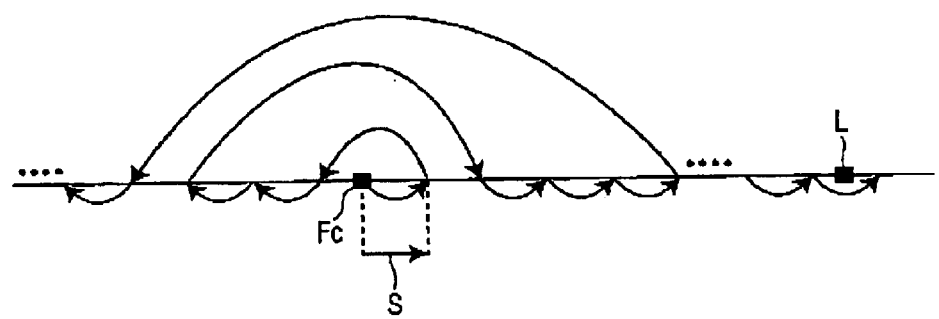
FIG. 4 represents an example of a coverage of the frequency band with a phase-locked loop according to the invention.

In FIG. 4 is shown an example of the band being covered by the oscillator. The oscillator covers in the following order:

the central part (0) of the band, then on the side of the higher frequencies the band part (+1), then on the side of the lower frequencies, the band parts (−1), (−2), (−3), then on the side of the higher frequencies, the band parts (+2) to (+5), then again on the side of the lower frequencies the band parts (−4) and (−5), the oscillator subsequently goes back and forth several times between the side of the higher frequencies and the side of the lower frequencies, finally, after having covered the band part (−11) on the side of the lower frequencies, it definitively returns to the side of the higher frequencies, the band part (+25) is locked on to.

The information produced by the loop filter is of a running type although the error to be recovered is very far from the linear operating area of the detector. As one approaches the frequency to be reached, more and more information will be obtained from the side of the detector. Based on a certain difference, the information obtained becomes very reliable and the parts of the band are always covered in the same direction. Finally, starting from the central frequency of the band to be covered and by choosing the order in which the band parts are covered, which has just been indicated, the invention permits to reduce the number of band parts to be covered to obtain the lock-on.

Outside the lock-on area, the output of the detector is an information carrier. The convergence is thus faster when one uses as a criterion of choice the sign of the correction on the output of the loop filter than when one uses a totally random criterion or, in contrast, a totally defined criterion.

Figure 5:
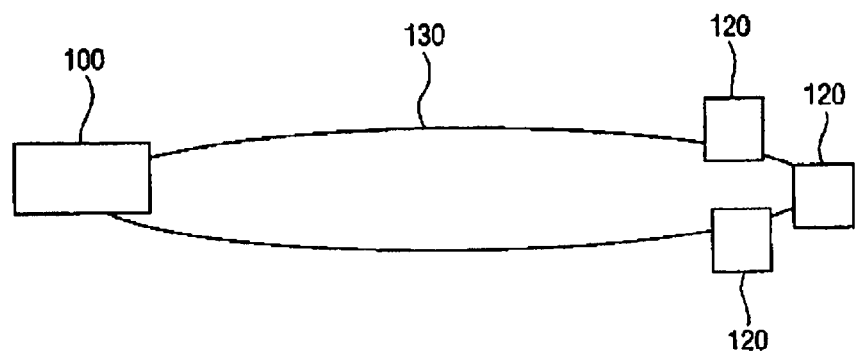
FIG. 5 represents an example of a digital communication system according to the invention.

In FIG. 5 is shown an example of a communication system according to the invention. This communication system comprises a head-end station 100 which is a transmitter in the sense of the invention, user terminals 120 which are receivers in the sense of the invention and a transmission medium 130. The head-end station 100 transmits signals to the user terminals via the transmission medium 130. The transmission medium 130 is formed, for example, by a cable network or a satellite transmission network.

Figure 6:
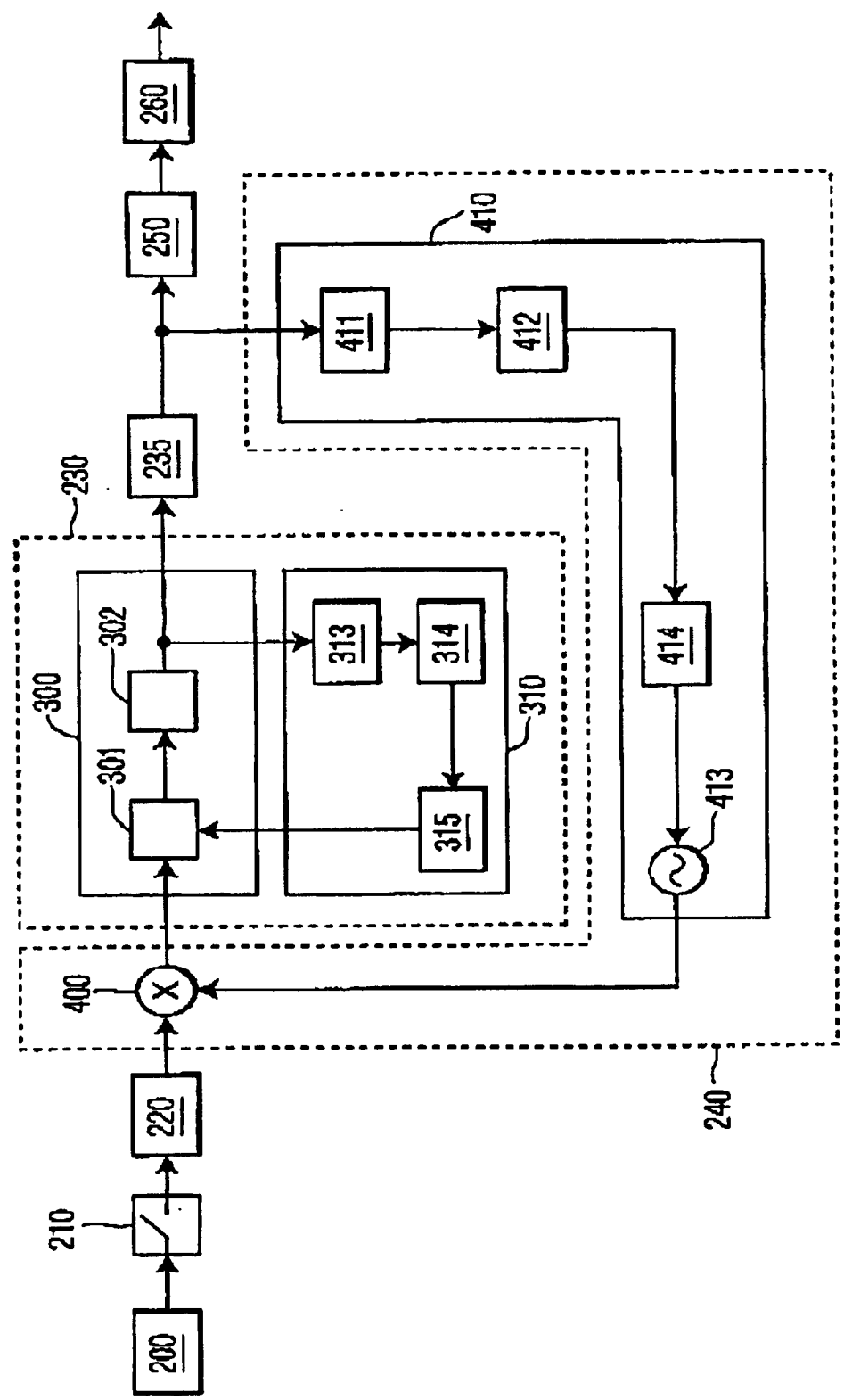
FIG. 6 represents an example of a signal receiver according to the invention.

In FIG. 6 is shown an example of a receiver according to the invention. Such a receiver comprises a conventional demodulation circuit 200 which delivers a signal translated to the baseband. This baseband signal is sampled by an oversampling device 210. The obtained samples are supplied to an automatic gain control circuit 220. The samples obtained on the output of the automatic gain control circuit are processed by a clock recovery circuit 230. The clock recovery circuit 230 determines the optimal sampling instant and regenerates symbols based on the obtained samples. These symbols are applied to an equalizer 235 and thereafter to a carrier recovery circuit 240. The symbols delivered on the output of the carrier recovery circuit 240 are applied to a phase correction circuit 250. The corrected symbols are then processed by conventional decoding means 260.

The clock recovery circuit 230 and the carrier recovery circuit 240 comprise each a phase-locked loop according to the invention.

The clock recovery circuit 230 comprises a correction module 300 and a phase-locked loop 310. The correction module 300 is formed by an interpolator 301 and a Nyquist filter 302. The interpolator 301 receives a plurality of input samples and generates an output sample which is to coincide with a received symbol. The phase-locked loop 310 comprises a detector 313, a loop filter 314 and a controller 315. The detector 313 detects a frequency error based on the symbols available on the output of the Nyquist filter. The loop filter 314 is a second-order low-pass filter whose function is to integrate the obtained errors so as to apply a frequency correction to the controller 315. The controller 315 comprises a digitally controlled oscillator controlled in accordance with a control method as described with reference to FIG. 3. The generated oscillation is used by the controller for indicating to the interpolator 301 the sample it is to calculate. When the lock-on is achieved, each output sample coincides with a received symbol.

The carrier recovery circuit 240 comprises a correction module 400 and a phase-locked loop 410. The correction module 400 is formed by a multiplier placed at the input of the clock recovery circuit 230. The phase-locked loop 410 comprises a detector 411, a loop filter 412 and an oscillator 413 digitally controlled by a controller 414 in accordance with a control method as described with reference to FIG. 3. The detector receives the symbols delivered by the equalizer 235. It determines a frequency error based on these symbols. The loop filter 412 integrates the obtained errors to apply a correction to the controller 414. The controller 414 controls the oscillator 413. The provided oscillation is applied to the multiplier so as to correct the demodulation frequency of the input samples of the clock recovery circuit 230.

What is claimed is:

1. A communication system comprising:
   at least a signal transmitter; and
   a signal receiver, the signal receiver including at least a phase-locked loop that comprises an error detector and a controller for controlling a local oscillator, which may cover a certain frequency band part by part to minimize an error determined by the error detector, wherein the controller comprises:
- means for choosing an initial part of the band to be covered, and
- means for choosing as the next part of the band to be covered the part that has not yet been covered based upon a sign of an error signal from the error detector, the error signal being detected from the previous part of the band.

2. A signal receiver intended to be used in a communication system as claimed in claim 1.

3. An integrated circuit comprising:
at least a phase-locked loop that includes an error detector and a controller for controlling a local oscillator, which may cover a certain frequency band part by part to minimize an error determined by the error detector, wherein the controller comprises:
- means for choosing an initial part of the band to be covered, and
- means for choosing as the next part of the band to be covered the part that has not yet been covered based upon a sign of an error signal from the error detector, the error signal being detected from the previous part of the band.

4. A method of controlling a local oscillator intended to be used in a phase-locked loop including an error detector and which may cover a certain frequency band part by part, the method comprising the steps of:

- selecting an initial part of the band to be covered, the initial part of the band being close to the center of the frequency band;
- selecting a next part of the band to be covered, the next part of the band to be covered being formed by the part of the band that has not yet been covered based upon a sign of an error signal from the error detector, the error signal being detected from the previous part of the band.

5. A computer program comprising means for executing a method as claimed in claim 4 for controlling a local oscillator of a phase-locked loop.

\* \* \* \* \*